(12) United States Patent
Koi et al.

(10) Patent No.: US 6,816,347 B2
(45) Date of Patent: Nov. 9, 2004

(54) MAGNETORESISTIVE ELEMENT AND MAGNETIC RECORDING APPARATUS

(75) Inventors: Katsuhiko Koi, Kawasaki (JP); Hitoshi Iwasaki, Yokosuka (JP); Yuzo Kamiguchi, Yokohama (JP); Hiromi Fuke, Kawasaki (JP); Hideaki Fukuzawa, Kawasaki (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/749,522

(22) Filed: Dec. 28, 2000

(65) Prior Publication Data

US 2001/0013999 A1 Aug. 16, 2001

(30) Foreign Application Priority Data

Dec. 28, 1999 (JP) ............................................. 11-373996

(51) Int. Cl.$^7$ ................................................ G11B 5/39
(52) U.S. Cl. .................................................. 360/324.11
(58) Field of Search ........................ 360/324.11, 324.1, 360/324.12, 126, 313, 131, 324.2, 327.31, 327.32; 29/603.14; 324/252; 148/404; 216/22

(56) References Cited

U.S. PATENT DOCUMENTS

| | | | | | |
|---|---|---|---|---|---|
| 4,054,469 A | * | 10/1977 | Jackson | ...................... | 148/404 |
| 5,726,838 A | * | 3/1998 | Soeya et al. | ............ | 360/327.32 |
| 5,898,549 A | * | 4/1999 | Gill | ........................ | 360/324.11 |
| 6,023,395 A | * | 2/2000 | Dill et al. | ................. | 360/324.2 |
| 6,046,892 A | * | 4/2000 | Aoshima et al. | ........ | 360/324.11 |
| 6,134,090 A | * | 10/2000 | Mao et al. | ................ | 360/324.1 |
| 6,154,349 A | * | 11/2000 | Kanai et al. | ............ | 360/324.12 |
| 6,210,818 B1 | * | 4/2001 | Saito | ........................... | 324/252 |
| 6,226,159 B1 | * | 5/2001 | Pinarbasi | ................ | 360/324.11 |
| 6,249,406 B1 | * | 6/2001 | Gill et al. | ............... | 360/324.11 |
| 6,278,595 B1 | * | 8/2001 | Xue et al. | ............... | 360/327.31 |
| 6,301,088 B1 | * | 10/2001 | Nakada | .................. | 360/324.11 |
| 6,327,122 B1 | * | 12/2001 | Pinarbasi | ................ | 360/324.11 |
| 6,348,274 B1 | * | 2/2002 | Kamiguchi et al. | ......... | 360/313 |
| 6,388,847 B1 | * | 5/2002 | Horng et al. | ............. | 29/603.14 |
| 6,403,240 B1 | * | 6/2002 | Kanbe et al. | ................ | 360/131 |
| 6,524,491 B1 | * | 2/2003 | Liu et al. | ....................... | 216/22 |
| 6,587,317 B2 | * | 7/2003 | Gill | ........................ | 360/324.11 |

FOREIGN PATENT DOCUMENTS

JP         2001-118219         4/2001

* cited by examiner

Primary Examiner—Tianjie Chen
(74) Attorney, Agent, or Firm—Oblon, Spivak, McClelland, Maier & Neustadt, P.C.

(57) ABSTRACT

A first layer region of a magnetically pinned layer in a spin valve structure, which is relatively remoter from a non-magnetic intermediate layer, is made of a ferromagnetic material containing at least one element selected from the group consisting of Cr (chrome), Rh (rhodium), Os (osmium), Re (rhenium), Si (silicon), Al (aluminum), Be (beryllium), Ga (gallium), Ge (germanium), Te (tellurium), B (boron), V (vanadium), Ru (ruthenium), Ir (iridium), W (tungsten), Mo (molybdenum), Au (gold), Pt (platinum), Ag (silver) and Cu (copper). Thereby, it is possible to provide a structure of the magnetically pinned layer, which can be readily made using a conventional deposition method and can ensure a sufficient electron reflecting effect on the part of the magnetically pinned layer, and to provide a magnetoresistive element using a spin valve film including the particular structure.

22 Claims, 7 Drawing Sheets

MAGNETORESISTIVE ELEMENT AND MAGNETIC RECORDING APPARATUS

BACKGROUND OF THE INVENTION

This invention relates to a magnetoresistive element and a magnetic recording apparatus, and more particularly, to a magnetoresistive element using a spin valve film including electron reflective layers on opposite surfaces of a non-magnetic intermediate layer, and a magnetic recording apparatus using this magnetoresistive element in its magnetic head.

Recently, for a higher density of HDD (hard disk drive), read elements with higher sensitivities are under development. Toward such purposes, researches are being made about elements using a giant magnetoresistance effect basically configured to interpose a non-magnetic conductive layer between two metal magnetic layers.

Hopeful one of those elements is an element having a structure called "spin valve". This is an element interposing a non-magnetic layer between two metal ferromagnetic layers of which one ferromagnetic layer (called "magnetically fixed layer" or "pinned layer") is fixed with a bias magnetic field, or the like, whereas the other ferromagnetic layer, not magnetically fixed, (called "magnetically free layer" or "free layer") reads out the magnetic field from the recording medium and changes its magnetic orientation relative to that of the former magnetic layer, thereby to obtain a giant magnetic resistance (see Phys. Rev. B. Vol. 45, 806(1992), J. Appl. Phys. Vol. 69, 4774(1991), etc.).

Researches are also being made about a model using a multi-layered structure that is construction repeat of a non-magnetic layer between metal ferromagnetic layers to enhance the magnetoresistance effect. In these models, however, interaction between magnetic layers is great, in general, and they invite some problems when used in HDD, such as insufficient sensitivity to a medium magnetic field.

Various improvements were proposed and made for obtaining higher outputs with these multi-layered structures. Among them, what is most effective is to thin the magnetically free layer and the non-magnetic intermediate layer. By thinning these films, shunt diversion can be reduced and output can be improved. There has been proposed a spin filter/spin valve structure attaining both output enhancement by thinning films and bias point adjustment in head designing, a spin valve film having a resistance changing ratio (MR) around 9% and a magnetic head compatible with HDD having the surface density of 25 Gbpsi (gigabit per square inch) have been obtained.

In this structure, however, the maximum MR is less than 10%, and it is insufficient for coping with future recording densities of 40 Gbpsi or even more. Therefore, researches are continued toward new structures for further improved MR.

Among those structures, specular spin valves (SPSV) are currently the most hopeful structure. They are configured to stack an electron specular reflective layer on a magnetic layer to thereby elongate the mean free path so as to accomplish a structure equivalent to a magnetic multi-layered film and increase the resistance-changing ratio. Concerning this type of structure, heretofore reported are electron specular reflectance effects with oxide antiferromagnetic materials such NiO used as exchange bias films of magnetically pinned layers, amorphous Ta formed as a base layer of a magnetically free layer, or noble metal layers. There is also reported that MR is improved by electron reflection when oxide layers on the order of nanometer are formed in a magnetically pinned layer and a magnetically free layer (IEEE Trans. Mag., Vol. 33, No. 5, p3580, 9(1997), IEEE Trans. Mag., Vol. 32, No. 5, p4728, 9(1996)).

Among those conventional structures, those using an oxide antiferromagnetic material such as NiO as the exchange bias film involve the problem of a small exchange coupling force due to the natures peculiar to the materials. Additionally, when introducing a magnetically pinned layer having a synthetic antiferromagnetic structure, which is currently an indispensable structural item, electron reflection from the oxide exchange bias layer no longer contributes to MR, and the merit of MR improvement is lost.

Further, Ru (ruthenium) used in the coupling layer of a synthetic antiferromagnetic structure is a substance providing no electron reflecting effect. On the other hand, if amorphous Ta (tantalum) is used, it adversely affects good growth of films, and invites deterioration of soft-magnetic characteristics of the magnetically free layer, thermal stability of MR, thermal stability of magnetic pinning of the magnetically pinned layer and synthetic antiferromagnetic coupling.

Furthermore, if a noble metal or amorphous Ta layer is formed on the part of the magnetically pinned layer, magnetic coupling between layers on opposite sides thereof will be disconnected, and it is therefore inappropriate as a technique for obtaining electron-reflecting effects. For the purpose of maximizing MR, it is desirable that electron reflection occurs both in the magnetically free layer and the magnetically pinned layer.

The above-mentioned problem will be overcome with a method of making magnetic oxide layers of a thickness on the order of nanometer in the magnetically pinned layer and the magnetically free layer. This method, however, involves the problems, such as the need for a technically high-level process for making the oxide layer of a thickness on the order of nanometer, the need for a special processing apparatus, and the need for a time for fabrication.

As explained above, it is necessary for maximizing MR to make electron reflecting layers in both the magnetically free layer and the magnetically pinned layer, but the method of obtaining an electron reflection effect on the part of the magnetically pinned layer is currently only the method of making an oxide layer on the order of nanometer, and involved the problem that a high-level technique is required to make it.

SUMMARY OF THE INVENTION

The present invention has been made from recognition of those problems. It is therefore an object of the invention to provide a structure of a magnetically pinned layer ensuring a sufficient electron reflection effect on the part of the magnetically pinned layer, and a magnetoresistive element using a pin valve film including the structure.

In order to attain the object, a magnetoresistive element according to the invention includes a magnetically free layer, a magnetically pinned layer, and a non-magnetic intermediate layer interposed between the magnetically free layer and the magnetically pinned layer, wherein the magnetically pinned layer includes, at least, a first layer region disposed relatively remoter from the non-magnetic intermediate layer and a second layer region disposed relatively closer to the non-magnetic intermediate layer, and the first layer region is made of a ferromagnetic material containing a special additive element.

The additive element is one that can effectively change the electron potential of the magnetically pinned layer and can simultaneously maintain the crystal structure of the magnetically pinned layer. Usable as its additive element is any one selected from Cr (chrome), Rh (rhodium), Os (osmium), Re (rhenium), Si (silicon), Al (aluminum), Be (beryllium), Ga (gallium), Ge (germanium), Te (tellurium), B (boron), V (vanadium), Ru (ruthenium), Ir (iridium), W (tungsten), Mo (molybdenum), Au (gold), Pt (platinum), Ag (silver) and Cu (copper).

By addition of one or more of these elements, the magnetically pinned layer can be changed in electron potential, and electron reflection can be brought about along the boundary. Nb (niobium), Ta (tantalum), or other like materials, are not suitable as the additive elements because they change the crystal to microcrystal. Change of the crystal to microcrystal or amorphous form will adversely affects the crystallographic property of the film grown thereon.

For example, in case of a bottom spin valve having the magnetically free layer disposed above the magnetically pinned layer, since the crystalline property and orientation of the film formed above the first layer region to function as the electron reflecting layer are deteriorated, the soft-magnetic property of the magnetically free layer is deteriorated. More specifically, from the viewpoint of the MR merit, the magnetically free layer is preferably a Co alloy, but in this case, the fcc-Co alloy has to be (111)-oriented to ensure a soft-magnetic property. Therefore, the first layer region serving as the electron-reflecting layer is preferably of a crystal. Further, In a fcc (face centered cubit) or hcp (hexagonal closest packed) structure, the closest-packed atomic plane is preferably oriented in parallel to the major surface of the layer, that is, the film surface, and more preferably fcc(111)-oriented. Additionally, deterioration of the crystalline property will cause atomic diffusion and will invite deterioration of MR.

For example, in case of a top spin valve in which the magnetically free layer is disposed below the magnetically pinned layer on a substrate, the film formed on the first layer region serving as the electron reflecting layer will deteriorates in crystalline property and orientation, and therefore, the antiferromagnetic coupling in the synthetic antiferromagnetic structure will weaken. Further, since deterioration of the crystalline property causes atomic diffusion, it not only deteriorates MR but also causes the phenomenon that an Ru layer having a thickness around 1 nm, which is normally used for making the synthetic antiferromagnetic structure, diffuses and eventually destructs the synthetic antiferromagnetic structure.

From those reasons, the additive element for increasing the electron potential is desired not to change the crystalline property. Any of the above-indicated additive elements does not change the crystallographic property even when added to a crystalline ferromagnetic alloy, and does not deteriorate the quality of the film formed thereon. Moreover, when one of Cr, Rh, Os, Re, Si, Al, Be, Ga and Ge, in particular, is used among those proposed additive elements, good crystalline quality will be obtained.

It is important, however, that the ratio of the additive element must be within a value that does not remove the magnetism of the original ferromagnetic metal. Once the layer loses magnetism, it will no longer function as the magnetically pinned layer. For example, when the matrix material of the magnetically pinned layer is $Co_{90}Fe_{10}$, the amount of Cr added is 20% or more in atomic %, the ferromagnetic property will become instable. Therefore, the amount to be added should be limited to 20% or less. Preferably, its atomic percent is desired to be 15% or less. On the other hand, to ensure a sufficiently large potential difference, a certain ratio should be contained. An amount not less than 3% is preferable.

As the thickness increases, the first layer region added with the additive element is liable to cause a decrease of the output by shunt diversion, and it should be thinned previously. Through researches, the Inventor has found that desirable thickness of the first layer would be 2 nm or less. However, when the thickness decreases to a certain value, electron reflection effect will be lost due to atomic diffusion. From this viewpoint, the thickness is preferably determined 0.5 nm or more.

In any of those cases, all layers not contacting the non-magnetic intermediate layer among those magnetically pinned layers, are desirably raised in resistance because they do not contribute to MR effects but cause an output decreases by shunt diversion. Simultaneously, these layers are also desirable to maintain good crystalline properties in order to stabilize the magnetically pinned layer. For this point of view, the additive element for enhancing the resistance values of these layers should preferably be at least one selected from Cr, Rh, Os, Re, Si, Al, Be, Ga, Ge, Te, B, V, Ru, Ir, W, Mo, Au, Pt, Ag and Cu.

On the other hand, the magnetic recording apparatus according to the invention is characterized in including a magnetic head for writing or reading information on or from a magnetic recording medium, which magnetic head uses one of the above-summarized magnetoresistive elements, and ensures magnetic writing and reading with much higher density than conventional ones.

As summarized above, by using the invention, it is possible to make an electron-reflecting layer of a metal in the magnetically pinned layer without losing the synthetic ferromagnetic property and the soft-magnetic property of the magnetically free layer. As a result, it is possible to significantly enhance the output of the magnetoresistive element and realize a magnetic writing/reading system with a much higher recording density than conventional ones. Thus the industrial merit of the invention is great.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings.

DETAILED DESCRIPTION OF THE PREFERRED EMBODIMENTS

Explained below are embodiments of the invention with reference to the drawings.

Figure 1:
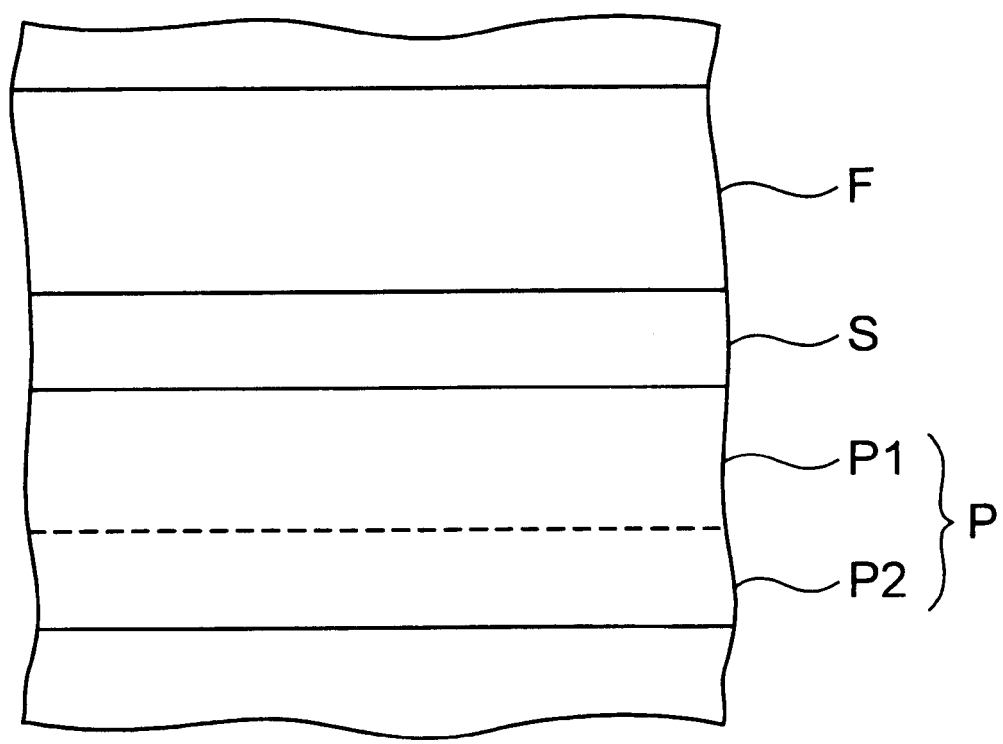
FIG. 1 is a diagram that schematically shows a sectional structure of a major part of a magnetoresistive element according to an embodiment of the invention.

FIG. 1 is a diagram that schematically shows a sectional structure of a major part of a magnetoresistive element according to an embodiment of the invention. That is, the magnetoresistive element according to the invention includes a multi-layered structure stacked on a substrate, or the like, not shown, and stacked in its major part are a magnetically free layer F, non-magnetic intermediate layer S and a magnetically pinned layer P. The magnetically pinned layer P includes a first layer region P1 distant from the non-magnetic intermediate layer S and a second layer region P2 in contact with the non-magnetic intermediate layer S. As to the stacking order, the magnetically free layer F may be placed upper, or oppositely lower.

An essential difference between the first layer region P1 and the second layer region P2 lies in the amount of a special additive element contained. The "special additive element" is an element that can change the electron potential of the magnetically pinned layer P and can maintain its crystalline structure, as explained later in greater detail. The first layer region P1 contains a larger amount of the special element than the second layer region P2.

In general, a ferromagnetic material containing cobalt iron (CoFe) or nickel iron (NiFe) as its major component is preferably used as the material of the magnetically pinned layer P. In relation to this material, usable as the special element satisfying the above-mentioned conditions are Cr (chrome), Rh (rhodium), Os (osmium), Re (rhenium), Si (silicon), Al (aluminum), Be (beryllium), Ga (gallium), Ge (germanium), Te (tellurium), B (boron), V (vanadium), Ru (ruthenium), Ir (iridium), W (tungsten), Mo (molybdenum), Au (gold), Pt (platinum), Ag (silver) and Cu (copper).

That is, according to the invention, the first layer region P1 remoter from the non-magnetic intermediate layer S contains a larger amount of one of the above-mentioned additive elements than the second layer region P2. As a result, the first layer region P1 is significantly different in electron potential from the second layer region P2, and can effectively reflect electrons at the boundary. Additionally, it can maintain the crystalline structure of the magnetically pinned layer and does not damage the magnetic characteristics of the multi-layered structure.

The first layer region P1 may be made by adding the additive element during deposition of the magnetically pinned layer P, or alternatively, it may be made by first stacking the magnetically pinned layer P and thereafter locally introducing the additive element by diffusion or ion implantation.

The magnetoresistive element according to the invention is now explained below with reference to some detailed specific examples.

Figure 2:
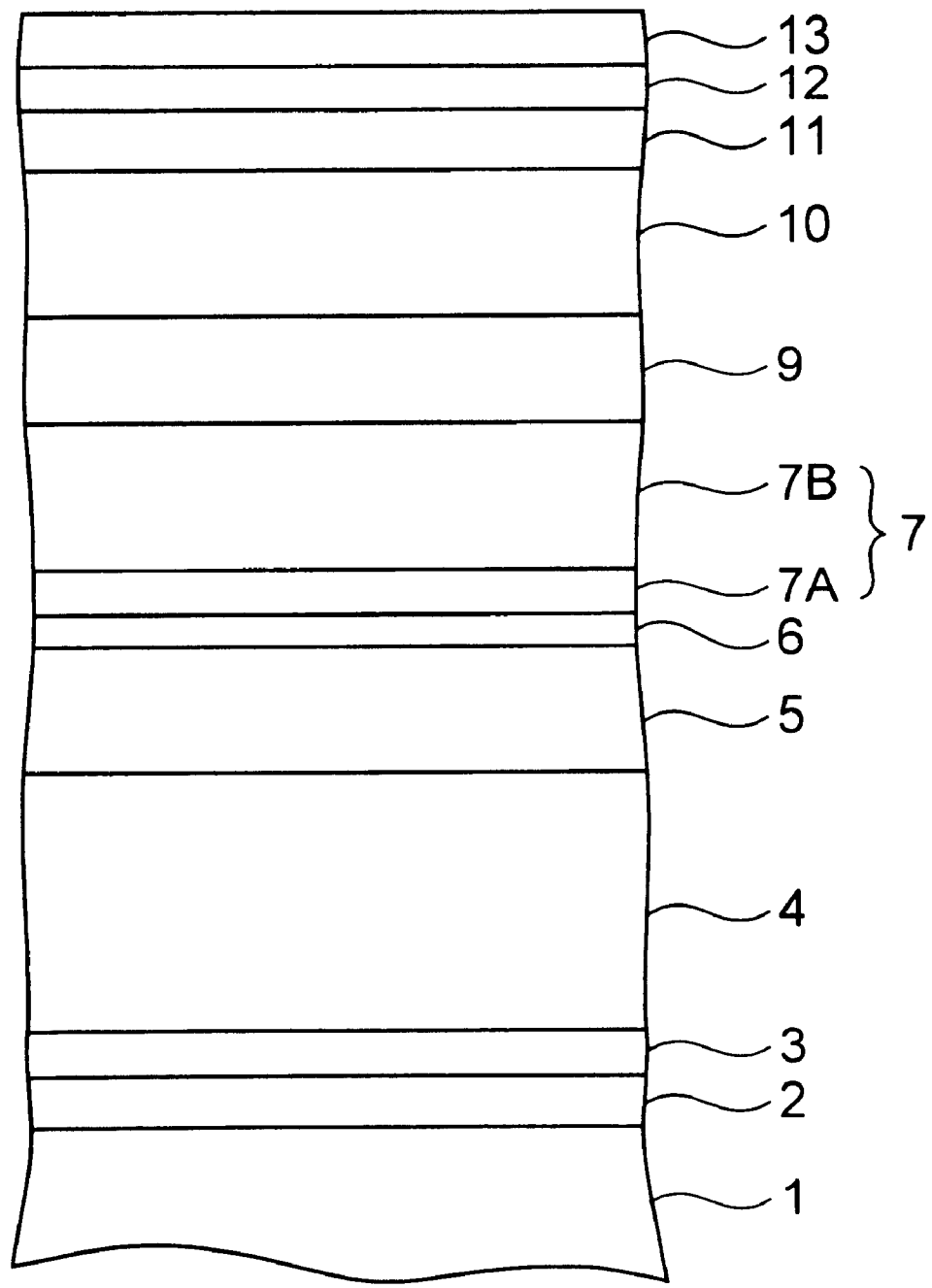
FIG. 2 is a diagram that schematically shows a sectional structure of a major part of a magnetoresistive element taken as a first specific example of the invention.

FIG. 2 is a diagram that schematically shows a sectional structure of a major part of a magnetoresistive element taken as a first specific example of the invention. That is, the magnetoresistive element shown here includes a first base layer 2, second layer 3, exchange bias layer 4, magnetically pinned layer 5, antiferromagnetic coupling layer 6, magnetically pinned layer 7, non-magnetic intermediate layer 9, magnetically free layer 10, high-conductive layer 11, electron reflecting layer 12, and protective layer 13 that are stacked on a substrate 1 in this order. The magnetically free layer 7 includes a first layer region 7A remoter from the non-magnetic intermediate layer 9 and a second layer region 7B adjacent to the non-magnetic intermediate layer 9.

These layers are individually explained below in greater detail.

The first layer is the substrate made of alumina or a silicon oxide.

The second and third layers are base layers. These layers preferably form a good base for fcc(111) orientation for the purpose of ensuring a good soft-magnetic property of the magnetically free layer 10. More specifically, when an fcc or hcp layer is stacked on a layer of Ta, Ti, Cr, their alloys, or any of those containing an additive element, the fcc(111) orientation can be obtained. Both the second and third layers do not contribute the MR effect, and therefore had better be as thin as possible. However, they need a certain degree of thickness to make a good closest-packed surface of fcc or hcp. Therefore, they each preferably have a thickness not less than 0.5 nm.

In a specific construction, a Ta layer having a thickness in the range from 0.5 to 10 nm is used as the first base layer 2, and stacked thereon is a material containing at least one kind of element selected from Sc, Ti, Cu, Zn, Y, Zr, Ru, Rh, Pd, Ag, Cd, Re, Os, Ir, Pt, Au, Tl, Pb and Ni as the second base layer 3 up to a thickness in the range from 0.5 to 10 nm.

The fourth layer is an exchange bias layer for pinning the magnetically pinned layer, and it is made of an antiferromagnetic material or a hard-magnetic material. Specifically, if the fourth layer is made of an anti-ferromagnetic material, a Mn-series ferromagnetic material or an oxide ferromagnetic material may be used. More specifically, any of IrMn, PtMn, FeMn, NiMn, RhMn and RuMn or any of these alloys added with an additive element, or alternatively, an oxide antiferromagnetic material or ferromagnetic material containing at least one element selected from Ni, Fe, Co and Mn, may be used. If the fourth layer is made of a hard-magnetic material, any of CoPt, CoCr and CoCrPt, for example, may be used.

When the fourth layer is made of a hard-magnetic material, the fifth layer may be omitted. The fourth layer can functions also as the fifth layer.

The fifth layer forms a part of the magnetically pinned layer. It is magnetically pinned in anti-parallel relative to the seventh layer, and functions to decrease effective magnetization of the entire magnetically pinned layer. This layer does not contribute to the MR effect. Therefore, for the purpose of minimizing the output loss by shunt diversion, it is preferably adjusted to have a high stability by addition of an additive element. From the same crystallographic viewpoint as the first layer region 7A, preferably used here as the additive element is any of Cr (chrome), Rh (rhodium), Os (osmium), Re (rhenium), Si (silicon), Al (aluminum), Be (beryllium), Ga (gallium), Ge (germanium), Te (tellurium), B (boron), V (vanadium), Ru (ruthenium), Ir (iridium), W (tungsten), Mo (molybdenum), Au (gold), Pt (platinum), Ag (silver) and Cu (copper). According to an advanced research by the Inventor, it is especially preferable to use Cr, Rh, Os, Re, Si, Al, Be, Ga or Ge among them.

In order to minimize the output loss by shunt diversion, the magnetically pinned layer 5 is preferably as thin as possible. However, in relation to magnetization of the seventh layer, its thickness must be adjusted to ensure a Ms·T (magnetization·thickness) product necessary for adjustment of the bias point. In case of a Co alloy, the thickness is preferably designed to be 1 to 3 nm.

The sixth layer (antiferromagnetic coupling layer) is a layer of a material selected from Ru (ruthenium), Rh (rhodium), Ir (iridium) and Cr (chrome) to couple the ferromagnetic layers on opposite surfaces thereof by a RKKY-like interaction. As magnetic coupling, ferromagnetic coupling and antiferromagnetic coupling alternately appear depending upon the thickness of the sixth layer. For antiferromagnetic coupling, thickness of the sixth layer is preferably around 1 nm.

The seventh layer is a magnetically pinned layer nearer to the non-magnetic intermediate layer, and it is divided into a first layer region 7A and a second layer region 7B. Their boundary, however, need not be sharp or clear, but it is sufficient that the boundary can effectively bring about electron reflection.

The first layer region 7A contains at least one of Cr (chrome), Rh (rhodium), Os (osmium), Re (rhenium), Si (silicon), Al (aluminum), Be (beryllium), Ga (gallium), Ge (germanium), Te (tellurium), B (boron), V (vanadium), Ru (ruthenium), Ir (iridium), W (tungsten), Mo (molybdenum), Au (gold), Pt (platinum), Ag (silver) and Cu (copper) by a larger amount than that of the second layer region 7B. It is especially preferable for the first layer region 7A to contain one or more of Cr, Rh, Os, Re, Si, Al, Be, Ga and Ge.

The second layer region 7B is made of a Co alloy, for example. It may contain a special additive element as mentioned above, but the amount of such an additive element should be smaller than that of the first layer region 7A.

The first layer region 7A will not function as a satisfactory electron-reflecting layer unless having a certain level of electron potential. Therefore, it is preferably adjusted in amount of the additive element to have a sufficiently larger resistance than the second layer region 7B. More specifically, the first layer region 7A preferably contains at least one of the above-mentioned specific elements by 3% or more in composition ratio, and more preferably by 5% or more. However, too much additive element will remove the ferromagnetic property. Therefore, amount of the additive element should not exceed 20%. The ferromagnetic alloy as the matrix metal is preferably selected from CoFe, NiFe, CoFeNi, CoNi, Co, Ni and Fe.

By adding the additive element under the above-mentioned conditions, resistance of the alloy, obtained, can be adjusted to 15 $\mu\Omega$cm or more. This level of resistance will bring about remarkable electron specular reflection at the boundary between the first layer region 7A and the second layer region 7B and will significantly improve MR. Thickness of the first layer region 7A is preferably not larger than 2 nm to reliably prevent an output decrease by shunt diversion. However, if it is as thin as 0.5 nm or less, the first layer region loses the resistance to atomic diffusion. Therefore, its thickness is preferably not less than 0.5 nm.

Further, the first layer region 7A is preferably crystalline to have a resistance to atomic diffusion. Being crystalline is important because it affects not only the thermal resistance of the first layer region 7A itself, but also the diffusion resistance of each layer stacked thereon at elevated temperatures. Especially, since the layer made of Ru, for example, and forming the antiferromagnetic coupling layer 6 is an extremely thin film as thin as 1 nm or so, the film in contact therewith is preferably crystalline to prevent diffusion. The above-indicated Cr, Rh, Os, Re, Si, Al, Be, Ga, Ge, Te, B, V, Ru, Ir, W, Mo, Au, Pt, Ag and Cu are preferable to obtain the the property because they do not change the crystal of the matrix metal ferromagnetic material to microcrystal or amorphous form. Among them, Cr, Rh, Os, Re, Si, Al, Be, Ga and Ge are especially preferable because they form a film excellent in grain size and crystallographic orientation. Furthermore, when one of Cr, Rh, Os, Re, Si, Al, Be, Ga and Ge is used, a larger antiferromagnetic coupling can be obtained in the antiferromagnetic coupling layer 6 than using one of Te, B, V, Ru, Ir, W, Mo, Au, Pt, Ag and Cu.

Additionally, antiferromagnetic coupling of the magnetic layers on opposite surfaces of the antiferromagnetic coupling layer 6 depends upon the crystalline orientation. Therefore, if these magnetic layers are amorphous or non-oriented, their interaction will be averaged and weakened. To prevent it, the upper and lower layers of the ferromagnetic coupling layer 6 are preferably made of oriented crystals. Since Ru (ruthenium) has a hcp crystalline structure, closest-packed surfaces such as fcc or hcp are preferably stacked to improve the crystalline matching. More preferably, in case of a bottom-type spin valve, the first layer region 7A is also fcc(111)-oriented in order to realize fcc(111) orientation of the magnetically free layer 10 formed above and obtain a soft-magnetic property. The above-mentioned candidates of the special element, i.e. Cr, Rh, Os, Re, Si, Al, Be, Ga, Ge, Te, B, V, Ru, Ir, W, Mo, Au, Pt, Ag and Cu, are preferable for satisfying the above conditions because they do not change the structure of the matrix metal ferromagnetic layer when it is fcc. Especially when one of Cr, Rh, Os, Re, Si, Al, Be, Ga and Ge is used, larger antiferromagnetic coupling can be obtained than using Te, B, V, Ru, Ir, W, Mo, Au, Pt, Ag and Cu.

Regarding the second layer region 7B, in order to obtain a good magnetoresistive property, it is desirable that the mean free path of electrons is long and the specific resistance is small accordingly. Simultaneously for maximizing the MR interfacial effect at the boundary with the non-magnetic intermediate layer 9, a Co alloy is preferably used. As to its thickness, since the output will decrease due to shut diversion with a thickness in excess of 4 nm, the thickness is preferably controlled within 4 nm, and more preferably within 3 nm. In case of a bottom-type spin valve, in order to realize fcc(111) orientation of the magnetically free layer formed above and to obtain a soft-magnetic property, closest-packed surfaces preferably stacked like fcc or hcp, and more preferably, it is fcc(111)-oriented.

The above-explained first layer region 7A and second layer region 7B can be made by changing the deposition condition from each other. For example, if sputtering is used, upon sputtering of the first layer region 7A, one of the above additive elements can be introduced into the film simultaneously with its deposition by using a target containing the additive element. As a result of this way of deposition, the boundary between the first layer region 7A and the second layer region 7B is generally sharp, and concentration profile of the additive element also changes sharply, in general, at the boundary between these layers.

In contrast, there is also a method for introducing the additive element into the first layer region 7A by diffusion or ion implantation after or during its deposition. In this case, the boundary between the first layer region 7A and the second layer region 7B will become somewhat dull, and concentration profile of the additive element also becomes gentle. However, as long as it falls in the range ensuring an effect as the electron-reflecting layer, it is of course that the first layer region 7A may be made by this method.

The tenth layer (magnetically free layer) is desirably made of a Co alloy from the viewpoint of MR. However, it is required to have a soft-magnetic property, it is preferably made of a fcc(111)-oriented Co alloy. More specifically, CoFe or CoFeNi is preferably used. Alternatively, a multi-layered structure of a Co alloy and NiFe may be used. Whichever material is used, excessively thick layer will invite an output decrease by shunt diversion, and the thickness is preferably controlled within 4 nm and more preferably within 3 nm. However, if this layer is as thin as 1 nm or less, it will decrease the soft-magnetic property and resistance to diffusion, its thickness is preferably not less than 1 nm and more preferably not less than 1.2 nm.

The magnetically pinned layers 7 and 5 in this specific example have a synthetic ferromagnetic structure coupled in magnetization in anti-parallel through the antiferromagnetic coupling layer as the sixth layer. The synthetic antiferromagnetic structure not only controls the effective Ms-product of the magnetically pinned layers thereby to improve the pinning force to an external field, but also controls the magnetostatic coupling with the magnetically free layer 10 due to a leak magnetic field. Therefore, it is quite an advantageous structure for adjustment of the bias point of the element output.

The eleventh layer (high conductive layer) has the role of enhancing MR by a spin filter effect, adjusting the bias point by the current magnetic field, and preventing deterioration of the soft-magnetic property of the magnetically free layer due to lamination with the electron reflecting layer 12. Preferable materials of the first layer are those containing at least one of Cu (copper), Au (gold), Ag (silver), Pt (platinum) and Pd (palladium). If its thickness is 0.5 nm or more, MR improvement by the spin filter effect will not be obtained, and the soft-magnetic property of the magnetically free layer 10 will be deteriorated. Therefore, the thickness is preferably not thinner than 0.5 nm. If the thickness is 3 nm or more, output will decrease due to shunt diversion. Therefore, the thickness is preferably not thicker than 3 nm.

The twelfth layer (electron reflecting layer) is used to obtain the effect of reflecting electrons that flow along the plane through the spin valve structure. Its preferable material may be a substance containing at least one of oxides, nitrides, carbides, fluorides, chlorides and borides. Alternatively, it may be a metal layer increased in resistance by addition of Cr, Rh, Os, Re, Si, Al, Be, Ga or Ge. However, insulators of oxides, nitrides, carbides, fluorides, chlorides or borides will provide larger effects.

The thirteenth layer is a protective film made of Ta, Ti or Cr.

Next explained is a magnetoresistive element taken as the second specific example of the invention.

Figure 3:
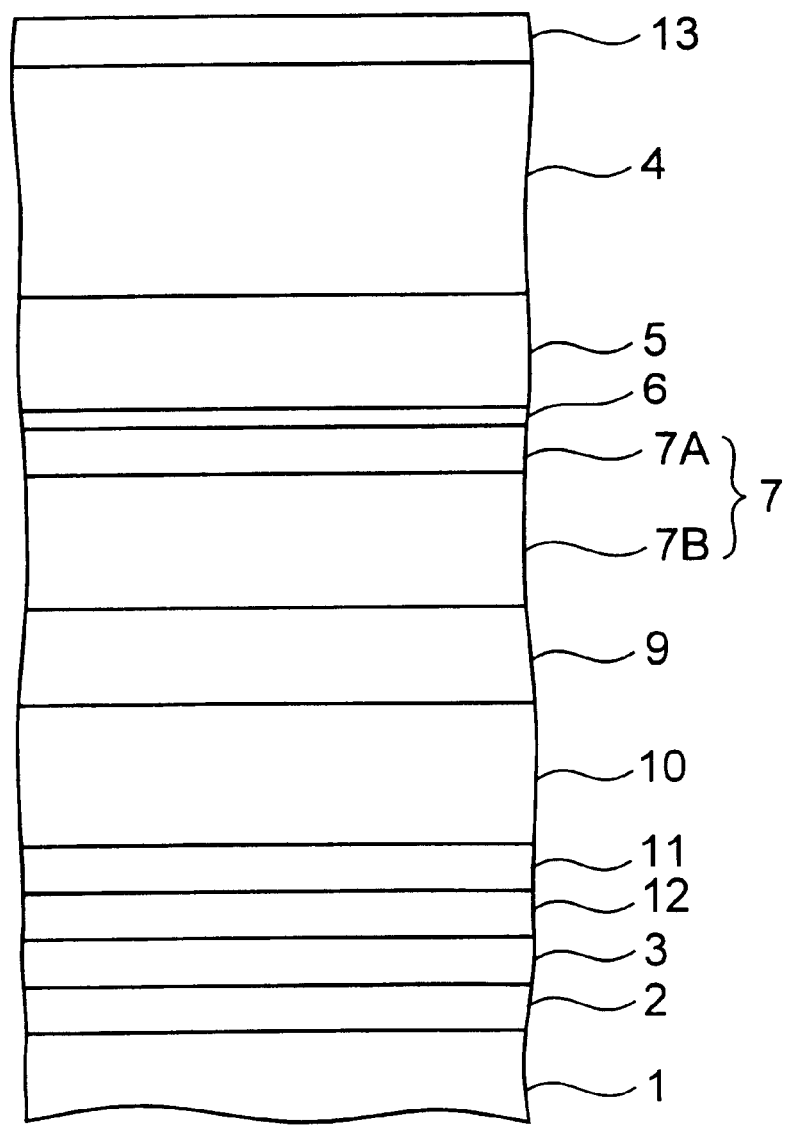
FIG. 3 is a diagram that schematically shows a sectional structure of a major part of a magnetoresistive element taken as a second specific example of the invention.

FIG. 3 is a diagram that schematically shows a sectional structure of a major part of a magnetoresistive element taken as a second specific example of the invention. The magnetoresistive element shown here has a structure configured upside down from the first specific example already explained with reference to FIG. 2. That is, it is made by stacking the first base layer 2, second base layer 3, electron reflecting layer 12, high-conductivity layer 11, magnetically free layer 10, non-magnetic intermediate layer 9, magnetically pinned layer 7, antiferromagnetic coupling layer 6, magnetically pinned layer 5, exchange bias layer 4, and protective film 13 in this order on the substrate 1. The magnetically free layer 7 includes the first layer region 7A distant from the non-magnetic intermediate layer 9 and the second layer region 7B adjacent to the non-magnetic intermediate layer 9.

Detailed explanation of this specific example is omitted while labeling the same or equivalent elements in FIG. 3 with reference numerals common to FIG. 2. In this specific example, since both of the magnetically pinned layers 5 and 7 are stacked above the magnetically free layer 10, there is no difference in influences to the soft-magnetic property of the magnetically free layer 10, whichever of fcc structure and hcp structure the crystalline structure takes.

Next explained is a magnetoresistive element taken as a third specific example of the invention.

Figure 4:
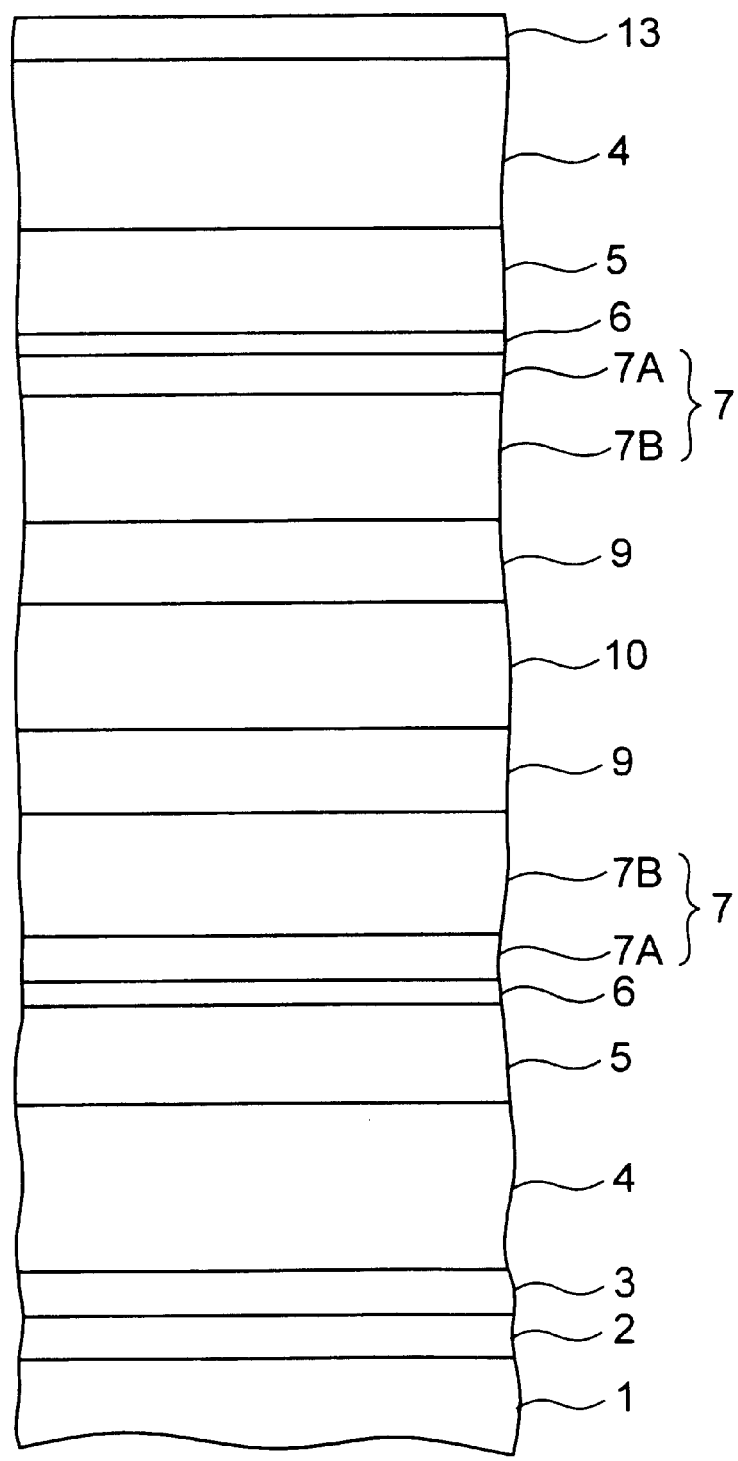
FIG. 4 a diagram that schematically shows a sectional structure of a major part of a magnetoresistive element taken as a third specific example of the invention.

FIG. 4 a diagram that schematically shows a sectional structure of a major part of a magnetoresistive element taken as a third specific example of the invention. The magnetoresistive element shown here has a so-called "dual spin valve structure" in which the pair of magnetically pinned layers 5, 7 are formed above and below the magnetically free layer 10, respectively. Films of this magnetoresistive element are stacked on the substrate 1 in the order of the first base layer 2, second base layer 3, exchange bias layer 4, magnetically pinned layer 5, antiferromagnetic coupling layer 6, magnetically pinned layer 7, non-magnetic intermediate layer 9, magnetically free layer 10, non-magnetic intermediate layer 9, magnetically pinned layer 7, antiferromagnetic coupling layer 5, magnetically pinned layer 5, exchange bias layer 4 and protective film 13. Here again, the same or equivalent elements of FIG. 4 as or to those of FIGS. 2 and 3 are labeled with common reference numerals, and explanation thereof is omitted here.

WORKING EXAMPLES

Explained below are working examples of the magnetoresistive element according to the invention.

Multi-layered structures having structures shown below on amorphous substrates were prepared by DC magnetron sputtering. In the structures shown below, numerals indicate film thickness values in the unit of nm (nanometers). For evaluation of all samples, they were annealed under 270° C. for 10 hours in the magnetic field of 7.5 kOe.

Working Example 1

5Ta/2NiFeCr/10PtMn/2CoFeCr/0.9Ru/x/2CoFe/2Cu/2CoFe/2Cu/1TaO/3Ta

Working Example 2

5Ta/2NiO/2Cu/2CoFe/2Cu/2CoFe/x/0.9Ru/2CoFeCr/10PtMn/5Ta

Working Example 3

5Ta/2NiFeCr/10PtMn/2CoFeCr/0.9Ru/x/2CoFe/2Cu/2CoFe/2Cu/2CoFe/x/0.9Ru/2CoFeCr/10PtMn/5Ta

Comparative Example 1

5Ta/2NiFeCr/10PtMn/2CoFeCr/0.9Ru/2.5CoFe/2Cu/2CoFe/2Cu/1TaO/3Ta

Comparative Example 2

5Ta/2NiFeCr/10PtMn/2CoFeCr/0.9Ru/2CoFe/2Cu/2CoFe2Cu/1TaO/3Ta

Comparative Example 3

5Ta/2NiO/2Cu/2CoFe/2Cu/2.5CoFe/0.9Ru/2CoFeCr/10PtMn/5Ta

Comparative Example 4

5Ta/2NiO/2Cu/2CoFe/2Cu/2CoFe/0.9Ru/2CoFeCr/10PtMn/5Ta

Comparative Example 5

5Ta/2NiFeCr/10PtMn/2CoFeCr/0.9Ru/2.5CoFe/2Cu/2CoFe/2Cu/2.5CoFe/0.9Ru/2CoFeCr/10PtMn/5Ta

Comparative Example 6

5Ta/2NiFeCr/10PtMn/2CoFeCr/0.9Ru/2CoFe/2Cu/2CoFe/2Cu/2CoFe/0.9Ru/2CoFeCr/10PtMn/5Ta

Compositions of the alloy targets used for deposition of layers x in the above structures are:

$(Co_{90}Fe_{10})_{94}A_6$ $(Ni_{80}Fe_{20})_{94}A_6$ where A is Cr, Rh, Os, Re, Si, Al, Be, Ga or Ge.

TaO and NiO were made by first making Ta and Ni, and thereafter maintaining in an oxygen atmosphere of $1\times10^{-5}$ Torr made in a chamber separately prepared from the deposition chamber for 300 seconds.

Results of measurement of MR and magnetic characteristics of those samples are collected below. Note that Hs is the saturation magnetic field for magnetization of the magnetically pinned layers, which represents intensity of synthetic antiferromagnetic coupling of the magnetically pinned layers, and Hc is the coercive force of the magnetically free layer.

| Matrixmetal | Additive Element A | MR | Hs(Oe) | Hc(Oe) |
|---|---|---|---|---|
| (Working Example 1) | | | | |
| CoFe | Cr | 15.1 | 5000 | 3 |
| CoFe | Rh | 14.9 | 4950 | 4 |
| CoFe | Os | 14.2 | 4900 | 3 |
| CoFe | Re | 14.3 | 4980 | 3.5 |
| CoFe | Si | 14.5 | 4750 | 3.5 |
| CoFe | Al | 14.3 | 5000 | 4 |
| CoFe | Be | 15 | 4960 | 3 |
| CoFe | Ga | 14.2 | 4900 | 3.6 |
| CoFe | Ge | 14 | 4980 | 3.8 |
| NiFe | Cr | 15.3 | 5150 | 4 |
| NiFe | Rh | 15 | 5000 | 3 |
| NiFe | Os | 14.1 | 4910 | 4 |
| NiFe | Re | 14.2 | 4800 | 3.2 |
| NiFe | Si | 14.8 | 4750 | 3.1 |
| NiFe | Al | 14.7 | 4900 | 3.8 |
| NiFe | Be | 14.9 | 4980 | 3.5 |
| NiFe | Ga | 14.9 | 5100 | 3.8 |
| NiFe | Ge | 14.7 | 5120 | 3.5 |
| (Working Example 2) | | | | |
| CoFe | Cr | 15 | 5500 | 3.2 |
| CoFe | Rh | 14 | 5400 | 3.6 |
| CoFe | Os | 14 | 5500 | 3.4 |
| CoFe | Re | 14.5 | 5600 | 3.8 |
| CoFe | Si | 14.2 | 5800 | 3.1 |
| CoFe | Al | 14.3 | 5200 | 3 |
| CoFe | Be | 14.6 | 5210 | 3.5 |
| CoFe | Ga | 14.8 | 5350 | 3.2 |
| CoFe | Ge | 14.2 | 5340 | 3.6 |
| NiFe | Cr | 15.1 | 5710 | 3.5 |
| NiFe | Rh | 15 | 5700 | 3.5 |
| NiFe | Os | 14.1 | 5610 | 3.6 |
| NiFe | Re | 14 | 5830 | 3.9 |
| NiFe | Si | 15 | 5910 | 3.5 |
| NiFe | Al | 14.6 | 5240 | 3.7 |
| NiFe | Be | 15 | 5220 | 3 |
| NiFe | Ga | 14.4 | 5470 | 3.1 |
| NiFe | Ge | 14.2 | 5485 | 3.8 |
| (Working Example 3) | | | | |
| CoFe | Cr | 16.5 | 5610 | 3.9 |
| CoFe | Rh | 16 | 5510 | 4 |
| CoFe | Os | 16.8 | 5500 | 4.2 |
| CoFe | Re | 16.9 | 5640 | 3.8 |
| CoFe | Si | 16 | 5810 | 3.6 |
| CoFe | Al | 16.2 | 5240 | 3.5 |
| CoFe | Be | 16.1 | 5260 | 3.9 |
| CoFe | Ga | 16.3 | 5290 | 3.7 |
| CoFe | Ge | 15.9 | 5390 | 3.9 |
| NiFe | Cr | 15.9 | 5810 | 3.8 |
| NiFe | Rh | 15.9 | 5810 | 4 |
| NiFe | Os | 16.1 | 5830 | 4 |
| NiFe | Re | 16.2 | 5890 | 4 |
| NiFe | Si | 16.2 | 6000 | 3.8 |
| NiFe | Al | 16.7 | 5280 | 3.9 |
| NiFe | Be | 16.9 | 5890 | 3.5 |
| NiFe | Ga | 16.2 | 5700 | 3.4 |
| NiFe | Ge | 16.3 | 5600 | 3.9 |

| Sample | MR(%) |
|---|---|
| Comparative Example 1 | 11 |
| Comparative Example 2 | 11.5 |
| Working Example 3 | 14.8 |
| Working Example 4 | 14.7 |
| Comparative Example 3 | 10.5 |
| Comparative Example 4 | 11 |
| Comparative Example 5 | 13.5 |
| Comparative Example 6 | 13.7 |

As apparent from the above-shown results, the structure (CoFe+Additive Element A) and the structure (NiFe+Additive Element A) were confirmed to provide very good MR enhancing effects. Samples of those working examples are measured with X rays. As a result, all samples had oriented structures with closest-packed atomic planes being stacked. Simultaneously, with all samples, soft-magnetic characteristics as good as 5 Oe or less were obtained.

Next prepared were the following samples as comparative examples.

Comparative Example 7

5Ta/2NiFeCr/10PtMn/2CoFeCr/0.9Ru/y/2CoFe/2Cu/2CoFe/2Cu/1TaO/3Ta

Comparative Example 8

5Ta/2NiFeCr/10PtMn/2CoFeCr/0.9Ru/y/2CoFe/2Cu/2CoFe/2Cu/1CoFe/1.8NiFe/2Cu/1TaO/3Ta

Comparative Example 9

5Ta/2NiO/2Cu/2CoFe/2Cu/2CoFe/y/0.9Ru/2CoFeCr/10PtMn/5Ta

Compositions of the alloy targets used for deposition of layers y in the above multi-layered structures are:

$(Co_{90}Fe_{10})_{94}B_6$ $(Ni_{80}Fe_{20})_{94}B_6$ where B is Ta or Nb.

Results of measurement of MR and magnetic characteristics of those samples are collected below.

| Matrix Metal | Additive Element B | MR | Hs(Oe) | Hc(Oe) |
|---|---|---|---|---|
| (Comparative Example 7) | | | | |
| CoFe | Nb | 13.8 | 2500 | 10 |
| CoFe | Ta | 13.5 | 2540 | 10.5 |
| NiFe | Nb | 13 | 2450 | 9 |
| NiFe | Ta | 13.5 | 2560 | 11 |
| (Comparative Example 8) | | | | |
| CoFe | Nb | 13.1 | 2550 | 9 |
| CoFe | Ta | 13 | 2510 | 10 |
| NiFe | Nb | 12.7 | 2510 | 8.8 |
| NiFe | Ta | 12.9 | 2600 | 9 |
| (Comparative Example 9) | | | | |
| CoFe | Nb | 12.9 | 3510 | 3.8 |
| CoFe | Ta | 12.8 | 3630 | 3.6 |
| NiFe | Nb | 12.7 | 3540 | 3.7 |
| NiFe | Ta | 12.6 | 3720 | 3.2 |

As apparent from those results, in any of the comparative examples 7, 8 and 9, Hs largely decreased. Through investigation by X-ray θ–2θ scanning, Comparative examples 7 and 8 were confirmed to have significantly decreased in peak intensity regarded as fcc(111) of the ferromagnetic layers, as compared with Working Example 1. It is assumed that changes of CeFeNb to microcrystal caused that decrease of the peak intensity. Reflecting it, Comparative Example 7 exhibited deterioration of characteristics, concerning both Hs and soft-magnetic property.

Additionally, in Comparative Examples 7 and 8, width of the locking curve increased, and soft-magnetic property also deteriorated. Although NiFe is adjusted here to a concentration with which a soft-magnetic property is obtained, when it is stacked with CoFe, orientation can be the to be important for the whole soft-magnetic property. MR also deteriorated probably because deterioration of the film quality weakened the resistance to thermal diffusion.

Comparative Example 8 exhibited no change concerning the soft-magnetic property, but its MR and Hs certainly degraded. In this way, it has been confirmed that maintenance of the crystalline property is very important for the magnetically pinned layer and the electron-reflecting layer. This was confirmed to be similarly applicable also to a dual spin valve.

As explained above with reference to some working examples, the present invention can realize a structure capable of enhancing the output by the electron reflecting layer made of a metal without damaging its magnetic property.

Further, although the above working examples use PtMn as the exchange bias film, those skilled in the art will readily understand that, even with other Mn antiferromagnetic materials and oxide antiferromagnetic materials, the same results can be obtained.

The magnetoresistive elements according to he invention, which have been explained heretofore by way of specific examples, can be used mainly in magnetic heads of HDD.

Figure 5:
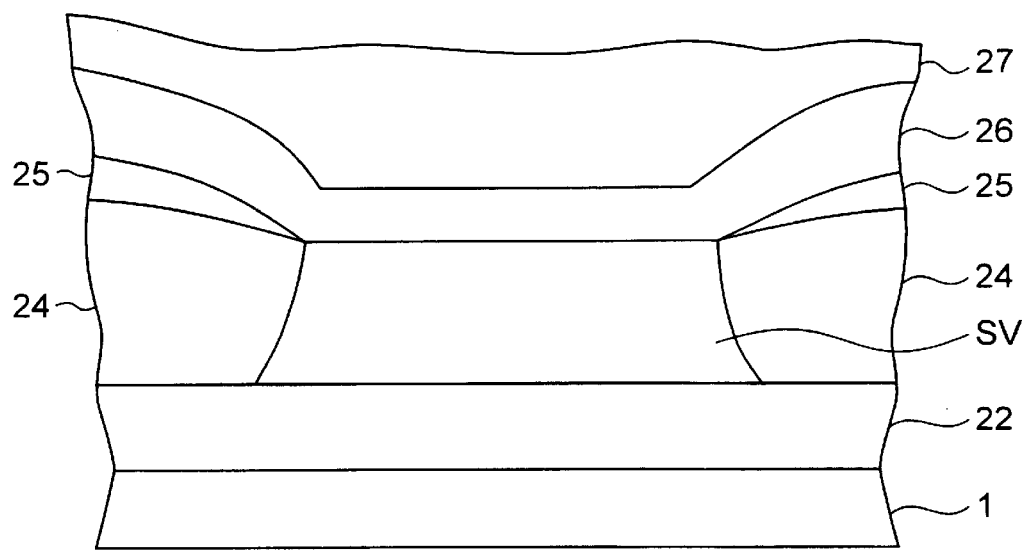
FIG. 5 is a diagram that schematically shows a configuration of a magnetic head using a magnetoresistive element according to the invention.

FIG. 5 is a diagram that schematically shows a configuration of a magnetic head using a magnetoresistive element according to the invention. This is a sectional view of a magnetic head having formed an abutted junction, taken from the surface opposed to the recording medium (air bearing surface: ABS).

In the magnetic head shown in FIG. 5, an alumina gap film 22 is formed on an $Al_2O_3$.TiC substrate 1, and a magnetoresistive element SV according to the invention is sandwiched between a pair of longitudinal bias films 24. Further formed on the longitudinal bias films 24, electrode leads 25 are made and, and the upper surface of the element is covered with a protective film 27 via an alumina gap film 26. The magnetoresistive element SV is one of those elements according to the invention, which were explained with reference to FIGS. 1 through 4, for example. The element, however, is made by using the alumina gap film 22 instead of the substrate 1 shown in those figures and stacking a predetermined multi-layered structure thereon.

The magnetic head used in the magnetoresistive element according to the invention can significantly enhance MR by electron reflecting layers on and under a conventional spin valve structure without deteriorating its property. As a result, recording density as high as 40 Gbpsi or even more can be realized.

Next explained is a magnetic recording apparatus according to the invention. The magnetic head using the magnetoresistive element according to the invention, as explained with reference to FIG. 5, can be incorporated in a magnetic head assembly of a recording/reproducing integral type, for example, and can be mounted in a magnetic recording apparatus.

Figure 6:
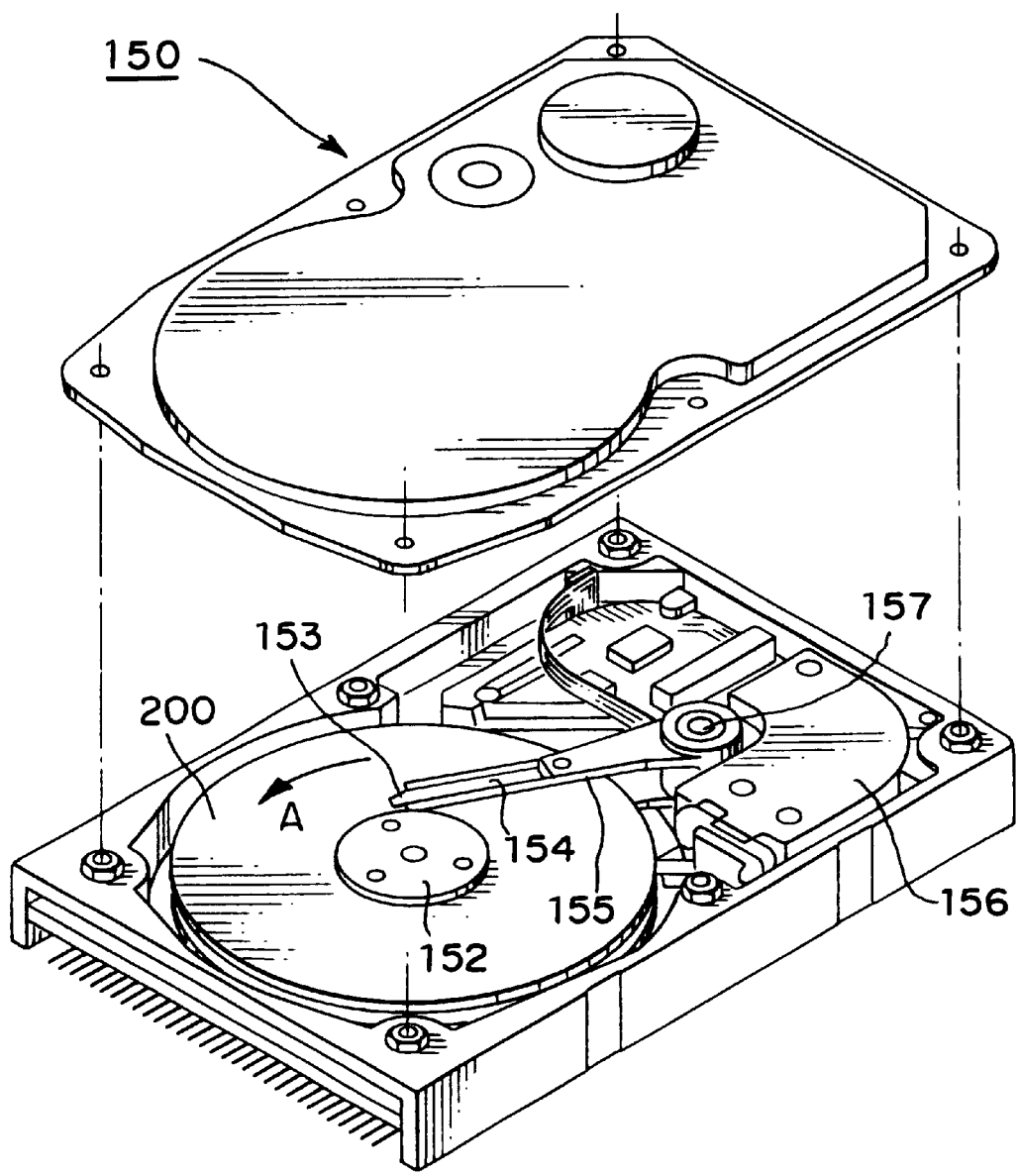
FIG. 6 is a perspective view that schematically shows a configuration of a major part of a magnetic recording/reproducing apparatus according to the invention.

FIG. 6 is a perspective view that schematically shows a configuration of a major part of a magnetic recording/reproducing apparatus according to the invention. The magnetic recording/reproducing apparatus 150 according to the invention is an apparatus of a type using a rotary actuator. In FIG. 6, a recording magnetic disk 200 is mounted on a spindle 152 and rotated in the arrow A direction by a motor, not shown, which is responsive to a control signal from a drive device controller, not shown. A head slider 153 executed recording or reproduction of information to be stored in the magnetic disk 200 is attached to the tip of a thin-film suspension 154. The head slider 153 includes the magnetic head according to the foregoing embodiment near its tip.

When the magnetic disk 200 rotates, the medium-fronted surface (ABS) of the head slider 153 is held with a predetermined floating amount from the surface of the magnetic disk 200.

The suspension 154 is connected to one end of an actuator arm 155 that has a bobbin portion for holding a drive coil, not shown. At the other end of the actuator arm 155, a voice coil motor 156, which is a kind of linear motor, is provided. The voice coil motor 156 is composed of a drive coil, not shown, wound up on the bobbin portion of the actuator arm 155, and a magnetic circuit made up of a permanent magnet and an opposed yoke disposed in confrontation so as to sandwich the drive coil.

The actuator arm 155 is held by ball bearings, not shown, which are provided upper and lower two positions of a rigid shaft 157 for free rotational and slidable movements with a driving force from the voice coil motor 156.

Figure 7:
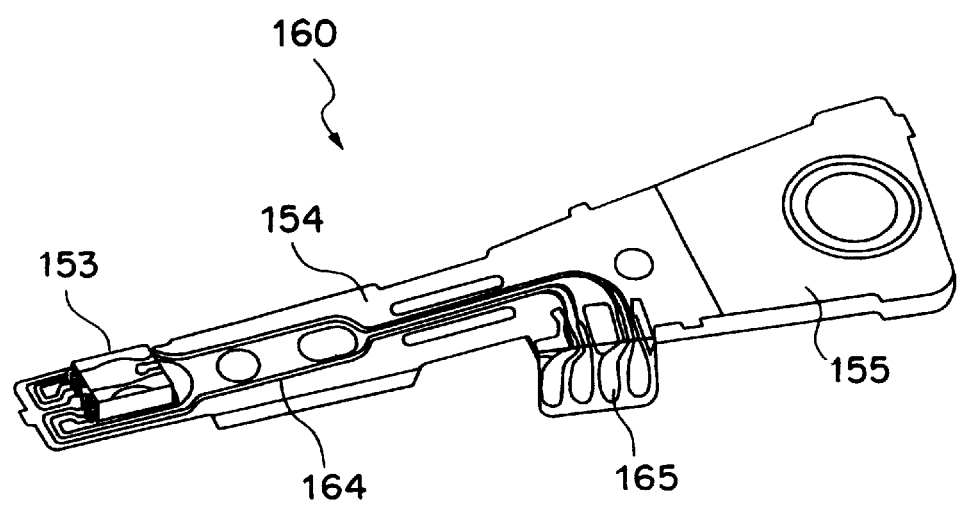
FIG. 7 is an enlarged, perspective view of a magnetic head assembly from the actuator arm 155 to its distal end in a magnetic writing/reading apparatus according to the invention, taken from the disk side.

FIG. 7 is an enlarged, perspective view of the magnetic head assembly from the actuator arm 155 to its distal end, taken from the disk side. The magnetic head assembly 160 includes the actuator arm 155 having the bobbin portion for holding the drive coil, for example, and the suspension 154 is connected to one end of the actuator arm 155.

At the extremity of the suspension 154, the head slider 153 incorporating the reproducing magnetic head already explained with reference to FIG. 5 is attached. A recording head may be combined with it. The suspension 154 has a lead line 164 for writing and reading signals, and the lead line 164 and electrodes of the magnetic head incorporated in the head slider 153 are electrically connected. Numeral 165 denotes an electrode pad of the magnetic head assembly 160.

The magnetic recording apparatus according to the invention, as shown in FIGS. 6 and 7, can greatly improve the recording density as compared with conventional systems, and can simultaneously improve the stability and reliability of reproduced signals.

Heretofore, embodiments of the invention have been explained in detail with reference to some specific examples. The invention, however, is not limited to these specific examples.

For example, in the spin valve structure the magnetoresistive element according to the invention has, matrix material and thickness of each layer may be appropriately selected by those skilled in the art within the known techniques to carry out the invention as taught in the specification and obtain equivalent effects.

Further, also concerning material and thickness of the substrate or protective film, and details of the synthetic structure, those skilled in the art will be able to carry out the invention by appropriately selecting a material or a thickness within the known techniques.

Furthermore, the magnetoresistive element according to the invention is not limited to the use in HDD as suggested in the specification, but also applicable to others, such as MRAM (magnetic random access memory) to obtain equivalent effects.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

The entire disclosure of Japanese Patent Application No. H11-373996 filed on Dec. 28, 1999 including specification, claims, drawings and summary is incorporated herein by reference in its entirety.

What is claimed is:

1. A magnetoresistive element comprising
a magnetically free layer;
a first magnetically pinned layer;
a non-magnetic intermediate layer interposed between the magnetically free layer and the first magnetically pinned layer;
a non-magnetic coupling layer located on one side of the first magnetically pinned layer opposite from the non-magnetic intermediate layer; and
a second magnetically pinned layer located on one side of the non-magnetic coupling layer opposite from the first magnetically pinned layer,
the first magnetically pinned layer and the second magnetically pinned layer do not contain niobium (Nb), tantalum (Ta) or (hafnium (Hf) and are fixed in magnetization in anti-parallel to each other via the non-magnetic coupling layer,
the first magnetically pinned layer including at least a first layer region located relatively remoter from the non-magnetic intermediate layer and a second layer region located relatively nearer to the non-magnetic intermediate layer,
the first layer region being made of a ferromagnetic material containing any one selected from the group consisting of Co, CoFe, CoFeNi and CoNi, as a major component and the ferromagnetic material containing at least one element selected from the group consisting of Cr (chrome), Rh (rhodium), Os (osmium), Re (rhenium), Si (silicon), Al (aluminum), Be (beryllium), Ga (gallium), Ge (germanium), Te (tellurium), V (vanadium), Ru (ruthenium), Ir (iridium), W (tungsten), Mo (molybdenum), Au (gold), Pt (platinum), Ag (silver) and Cu (copper).

2. The magnetoresistive element according to claim 1, wherein the second magnetically pinned layer is made of a ferromagnetic material containing at least one element selected from the group consisting of Cr (chrome), Rh (rhodium), Os (osmium), Re (rhenium), Si (silicon), Al (aluminum), Be (beryllium), Ga (gallium), Ge (germanium), Te (tellurium), V (vanadium), Ru (ruthenium), Ir (iridium), (tungsten), Mo (molybdenum), Au (gold), Pt (platinum), Ag (silver) and Cu (copper).

3. The magnetoresistive element according to claim 1, wherein the ferromagnetic material containing the element is crystalline.

4. The magnetoresistive element according to claim 1, wherein the magnetically free layer is made of a fcc Co alloy in which closest-packed atomic plane is oriented substantially in parallel with a major surface of the layer, and each of the first and second magnetically pinned layers is made of a fcc or hcp ferromagnetic material in which closest-packed atomic plane is oriented substantially in parallel with a major surface of the layers.

5. The magnetoresistive element according to claim 1, wherein concentration of the element in the first layer region is in the range from 3 atomic % to 20 atomic %.

6. The magnetoresistive element according to claim 1, wherein thickness of the first layer region is in the range from 0.5 nanometers to 2 nanometers.

7. The magnetoresistive element according to claim 1, wherein the magnetically free layer is a magnetic layer that changes in magnetic orientation with external magnetic field, and the first and second magnetically pinned layers are magnetic layers that are fixed in magnetic orientation to substantially one direction.

8. A magnetoresistive element comprising
a magnetically free layer;
a first magnetically pinned layer;
a non-magnetic intermediate layer interposed between the magnetically free layer and the first magnetically pinned layer;
a non-magnetic coupling layer located on one side of the first magnetically pinned layer opposite from the non-magnetic intermediate layer; and
a second magnetically pinned layer located on one side of the non-magnetic coupling layer opposite from the first magnetically pinned layer,
the first magnetically pinned layer and the second magnetically pinned layer do not contain niobium (Nb), tantalum (Ta) or hafnium (Hf) and are fixed in magnetization in anti-parallel to each other via the non-magnetic coupling layer,
the first magnetically pinned layer being made of a ferromagnetic material containing any one selected from the group consisting of Co, CoFe, CoFeNi and CoNi, as a major component and the ferromagnetic material containing at least one element selected from the group consisting of Cr (chrome), Rh (rhodium), Os (osmium), Re (rhenium), Si (silicon), Al (aluminum), Be (beryllium), Ga (gallium), Ge (germanium), Te (tellurium), V (vanadium), Ru (ruthenium), Ir (iridium), W (tungsten), Mo (molybdenum), Au (gold), Pt (platinum), Ag (silver) and Cu (copper), wherein an amount of the element contained in the first magnetically pinned layer being larger in a region thereof relatively remoter from the non-magnetic intermediate layer than a region thereof relatively nearer to the non-magnetic intermediate layer.

9. The magnetoresistive element according to claim 8, wherein the second magnetically pinned layer is made of a ferromagnetic material containing at least one element selected from the group consisting of Cr (chrome), Rh (rhodium), Os (osmium), Re (rhenium), Si (silicon), Al (aluminum), Be (beryllium), Ga (gallium), Ge (germanium), Te (tellurium), V (vanadium),Ru (ruthenium), Ir (iridium), W (tungsten), Mo (molybdenum), Au (gold), Pt (platinum), Ag (silver) and Cu (copper).

10. The magnetoresistive element according to claim 8, wherein the ferromagnetic material containing the element is crystalline.

11. The magnetoresistive element according to claim 8, wherein the magnetically free layer is made of a fcc Co alloy in which closest-packed atomic plane is oriented substantially in parallel with a major surface of the layer, and each of the first and second magnetically pinned layers is made of a fcc or hcp ferromagnetic material in which closest-packed atomic plane is oriented substantially in parallel with a major surface of the layers.

12. The magnetoresistive element according to claim 8, wherein the magnetically free layer is a magnetic layer that changes in magnetic orientation with external magnetic field, and the first and second magnetically pinned layers are magnetic layers that are fixed in magnetic orientation to substantially one direction.

13. A magnetic recording apparatus comprising a magnetic recording medium comprising a magnetoresistive element comprising a magnetically free layer;

a first magnetically pinned layer;

a non-magnetic intermediate layer interposed between the magnetically free layer and the first magnetically pinned layer;

a non-magnetic coupling layer located on one side of the first magnetically pinned layer opposite from the non-magnetic intermediate layer; and a second magnetically pinned layer located on one side of the non-magnetic coupling layer opposite from the first magnetically pinned layer, the first magnetically pinned layer and the second magnetically pinned layer do not contain niobium (Nb), tantalum (Ta) or hafnium (Hf) and are fixed in magnetization in anti-parallel to each other via the non-magnetic coupling layer, the first magnetically pinned layer including at least a first layer region located relatively remoter from the non-magnetic intermediate layer and a second layer region located relatively nearer to the non-magnetic intermediate layer, the first layer region being made of a ferromagnetic material containing any one selected from the group consisting of Co, CoFe, CoFeNi and CoNi, as a major component and the ferromagnetic material containing at least one element selected from the group consisting of Cr (chrome), Rh (rhodium), Os (osmium), Re (rhenium), Si (silicon), Al (aluminum), Be (beryllium), Ga (gallium), Ge (germanium), Te (tellurium), V (vanadium), Ru (ruthenium), Ir (iridium), W (tungsten), Mo (molybdenum), Au (gold), Pt (platinum), Ag (silver) and Cu (copper).

14. The magnetic recording apparatus according to claim 13, wherein the second magnetically pinned layer is made of a ferromagnetic material containing at least one element selected from the group consisting of Cr (chrome), Rh (rhodium), Os (osmium), Re (rhenium), Si (silicon), Al (aluminum), Be (beryllium), Ga (gallium), Ge (germanium), Te (tellurium), V (vanadium), Ru (ruthenium), Ir (iridium), W (tungsten), Mo (molybdenum), Au (gold), Pt (platinum), Ag (silver) and Cu (copper).

15. The magnetic recording apparatus according to claim 13, wherein concentration of the element in the first layer region is in the range from 3 atomic % to 20 atomic %.

16. The magnetic recording apparatus according to claim 13, wherein thickness of the first layer region is in the range from 0.5 nanometers to 2 nanometers.

17. A magnetic recording apparatus comprising a magnetic recording medium comprising a magnetoresistive element comprising a magnetically free layer;

a first magnetically pinned layer;

a non-magnetic intermediate layer interposed between the magnetically free layer and the first magnetically pinned layer;

a non-magnetic coupling layer located on one side of the first magnetically pinned layer opposite from the non-magnetic intermediate layer; and a second magnetically pinned layer located on one side of the non-magnetic coupling layer opposite from the first magnetically pinned layer, the first magnetically pinned layer and the second magnetically pinned layer do not contain niobium (Nb), tantalum (Ta) or hafnium (Hf) and are fixed in magnetization in anti-parallel to each other via the non-magnetic coupling layer, the first magnetically pinned layer being made of a ferromagnetic material containing any one selected from the group consisting of Co, CoFe, CoFeNi and CoNi, as a major component and the ferromagnetic material containing at least one element selected from the group consisting of Cr (chrome), Rh (rhodium), Os (osmium), Re (rhenium), Si (silicon), Al (aluminum), Be (beryllium), Ga (gallium), Ge (germanium), Te (tellurium), V (vanadium), Ru (ruthenium), Ir (iridium), W (tungsten), Mo (molybdenum), Au (gold), Pt (platinum), Ag (silver) and Cu (copper), wherein an amount of the element contained in the first magnetically pinned layer being larger in a region thereof relatively remoter from the non-magnetic intermediate layer than a region thereof relatively nearer to the non-magnetic intermediate layer.

18. The magnetic recording apparatus according to claim 17, wherein the second magnetically pinned layer is made of a ferromagnetic material containing at least one element selected from the group consisting of Cr (chrome), Rh (rhodium), Os (osmium), Re (rhenium), Si (silicon), Al (aluminum), Be (beryllium), Ga (gallium), Ge (germanium), Te (tellurium), V(vanadium), Ru (ruthenium), Ir (iridium), W (tungsten), Mo (molybdenum), Au (gold), Pt (platinum), Ag (silver) and Cu (copper).

19. The magnetic recording apparatus according to claim 17, wherein the ferromagnetic material containing the element is crystalline.

20. The magnetic recording apparatus according to claim 17, wherein the magnetically free layer is made of a fcc Co alloy in which closest-packed atomic plane is oriented substantially in parallel with a major surface of the layer, and each of the first and second magnetically pinned layers is made of a fcc or hcp ferromagnetic material in which closest-packed atomic plane is oriented substantially in parallel with a major surface of the layers.

21. A magnetoresistive element comprising a magnetically free layer;

a first magnetically pinned layer;

a non-magnetic intermediate layer interposed between the magnetically free layer and the first magnetically pinned layer;

a non-magnetic coupling layer located on one side of the first magnetically pinned layer opposite from the non-magnetic intermediate layer; and a second magnetically pinned layer located on one side of the non-magnetic coupling layer opposite from the first magnetically pinned layer, the first magnetically pinned layer and the second magnetically pinned layer being fixed in magnetization in anti-parallel to each other via the non-magnetic coupling layer, the first magnetically pinned layer including at least a first layer region located relatively remoter from the non-magnetic intermediate layer and a second layer region located relatively nearer to the non-magnetic intermediate layer, the first region layer being made of a ferromagnetic material containing NiFe as a major component and the ferromagnetic material containing at least one element selected from the group consisting of Os (osmium), Si (silicon), Be (beryllium), Ga (gallium), Ge (germanium), Te (tellurium), B (boron), V (vanadium), Ru (ruthenium), Ir (iridium), W (tungsten), Au (gold), Pt (platinum), Ag (silver) and Cu (copper).

22. A magnetoresistive element comprising a magnetically free layer;

a first magnetically pinned layer;

a non-magnetic intermediate layer interposed between the magnetically free layer and the first magnetically pinned layer;

a non-magnetic coupling layer located on one side of the first magnetically pinned layer opposite from the non-magnetic intermediate layer; and a second magnetically pinned layer located on one side of the non-magnetic coupling layer opposite from the first magnetically pinned layer, the first magnetically pinned layer and the second magnetically pinned layer being fixed in magnetization in anti-parallel to each other via the non-magnetic coupling layer, the first magnetically pinned layer being made of a ferromagnetic material containing NiFe as a major component and the ferromagnetic material containing at least one element selected from the group consisting of Os (osmium), Si (silicon), Be (beryllium), Ga (gallium), Ge (germanium), Te (tellurium), B (boron), V (vanadium), Ru (ruthenium), Ir (iridium), W (tungsten), Au (gold), Pt (platinum), Ag (silver) and Cu (copper), wherein an amount of the element contained in the first magnetically pinned layer is larger in a region thereof relatively remoter from the non-magnetic intermediate layer than a region thereof relatively nearer to the non-magnetic intermediate layer.

* * * * *